(12) United States Patent
Sjolander et al.

(10) Patent No.: US 8,104,692 B2
(45) Date of Patent: Jan. 31, 2012

(54) SYSTEM AND METHOD FOR GENERATING ROBUST FIDUCIAL PATTERNS USED TO DETERMINE COORDINATE TRANSFORMATIONS

(75) Inventors: Cary Eric Sjolander, Tigard, OR (US); Andrew S. Yeh, Portland, OR (US)

(73) Assignee: Xerox Corporation, Norwalk, CT (US)

( * ) Notice: Subject to any disclaimer, the term of this patent is extended or adjusted under 35 U.S.C. 154(b) by 378 days.

(21) Appl. No.: 12/390,948

(22) Filed: Feb. 23, 2009

(65) Prior Publication Data

US 2010/0214344 A1    Aug. 26, 2010

(51) Int. Cl.
 *G06K 19/06* (2006.01)
 *B41J 29/393* (2006.01)
(52) U.S. Cl. .................................. 235/494; 347/19
(58) Field of Classification Search .................. 347/19; 235/494, 436
 See application file for complete search history.

(56) References Cited

U.S. PATENT DOCUMENTS

| 5,414,448 | A |  | 5/1995 | Wada et al. |
| 5,937,083 | A |  | 8/1999 | Ostuni |
| 6,367,903 | B1 |  | 4/2002 | Gast et al. |
| 7,249,716 | B2 |  | 7/2007 | Bryborn |
| 2002/0171699 | A1 | * | 11/2002 | Choi ........................... 347/19 |
| 2002/0186884 | A1 | * | 12/2002 | Shaked et al. ............ 382/183 |
| 2003/0063275 | A1 | * | 4/2003 | Hubble et al. ............ 356/319 |
| 2005/0099446 | A1 | * | 5/2005 | Mizes et al. .............. 347/19 |
| 2005/0134623 | A1 | * | 6/2005 | Mizes ........................ 347/19 |
| 2005/0259874 | A1 | * | 11/2005 | Sano et al. ................. 382/218 |
| 2006/0096510 | A1 | * | 5/2006 | Kuki et al. ............... 112/102.5 |

* cited by examiner

*Primary Examiner* — Shelby Fidler
(74) *Attorney, Agent, or Firm* — Maginot, Moore & Beck, LLP

(57) ABSTRACT

A method generates and evaluates a fiducial pattern for an imaging system. The method includes generating a fiducial pattern for an image substrate, and measuring a difference between a structure of the fiducial pattern and at least one of a structure of a printing system and a structure of a measurement pattern to determine whether the structure of the fiducial pattern is distinguishable from at least one of the structure of the printing system and the structure of the measurement pattern.

36 Claims, 6 Drawing Sheets

SYSTEM AND METHOD FOR GENERATING ROBUST FIDUCIAL PATTERNS USED TO DETERMINE COORDINATE TRANSFORMATIONS

TECHNICAL FIELD

This disclosure relates generally to imaging devices that generate a coordinate transformation used to translate coordinates between external image substrates and templates stored within the device, and more particularly, for imaging devices that eject ink onto an image substrate to form a fiducial pattern on an image substrate that is used to generate a coordinate transformation.

BACKGROUND

Drop on demand inkjet technology for producing printed media has been employed in commercial products such as printers, multifunction products, plotters, and facsimile machines. Generally, an inkjet image is formed by selectively ejecting ink drops from a plurality of drop generators or inkjets, which are arranged in a printhead or a printhead assembly, onto an image substrate. For example, the printhead assembly and the image substrate are moved relative to one other and the inkjets are controlled to emit ink drops at appropriate times. The timing of the inkjet activation is performed by a printhead controller, which generates firing signals that activate the inkjets to eject ink. The image substrate may be an intermediate image member, such as a print drum or belt, from which the ink image is later transferred to a print medium, such as paper. The image substrate may also be a moving web of print medium or sheets of a print medium onto which the ink drops are directly ejected. The ink ejected from the inkjets may be liquid ink, such as aqueous, solvent, oil based, UV curable ink or the like, which is stored in containers installed in the printer. Alternatively, the ink may be loaded in a solid form that is delivered to a melting device, which heats the solid ink to its melting temperature to generate liquid ink that is supplied to a print head.

The magnitude, frequency, shape, and other aspects of the firing signals to the inkjets affect the amount of ink ejected from an inkjet. Manufacturing tolerances in printer production processes, however, cause inkjets to respond differently to the same firing signals. Additionally, manufacturing tolerances produce inkjets that eject ink in slightly different directions. Consequently, the landing position for an ink drop ejected from an inkjet nozzle may be different than nominally expected. During manufacture and in user facilities, test patterns may be printed on media or another type of imaging member, such as a drum or belt, and an optical sensor array may be used to sense a test pattern of ink drops. The test pattern provides information about some physical parameter of the ink drops, such as the presence, position, size, shape, and/or color of the ink drops.

Optical sensor arrays are used in printers to measure characteristics of ink ejected by inkjets of a print head. The sensor array is mounted with reference to a light source and an image substrate. The light source includes one or more light emitting diodes (LED) and optics for directing light. The light is directed towards the image substrate, which typically is media, a drum, or a belt. The sensor array is positioned to receive the light specularly, diffusely, or both reflected by the image substrate. The reflectance measurements may provide information about the presence, position, size, shape, color, other characteristics of the ink on the substrate. These measurements may be used to adjust driving signals to the nozzles or other imaging parameters and corrective actions.

A sensor array for detecting light reflected by an image substrate is typically used to measure the intensity of light reflected from a surface bearing an ink image. Such an array may be comprised of a plurality of charge coupled devices (CCDs) or contact image sensors (CISs) that are aligned on a support structure facing an image substrate. Other surface imaging systems include those that utilize various types of light collectors, such as prisms, light pipes, microscopic or other refractive lens systems. In some printers, a sensor array may include 600 sensing elements (pixels) per linear inch. Consequently, an 8.5 inch wide sensor array would have 5100 sensing elements. The sensing elements may respond differently to the same ink on the substrate because the characteristics of each photosensitive sensing element may differ. That is, the signal generated by one photosensitive sensing element in the array in response to a reflected light signal may differ from the signal generated by another photosensitive sensing element in the array in response to the same reflected light. Another issue affecting reflectance measurements obtained by sensor arrays is the structure of the image substrate. Many image substrates are rough and highly structured. Some sections of the surface reflect light more intensely into the light sensor, while other sections absorb more light and reflect less light into the sensor.

Another issue affecting reflectance measurement is absence of uniformity across the image substrate in the light source. The amount of light reflected by ink on the substrate and detected by the sensor depends upon the amount of incident light. Registration between a light source, image substrate, and optical sensor may also affect reflectance measurements. The light collected by the sensor is dependent upon the distances and angles between a light source, image substrate, and optical sensor. Variations in these characteristics across the array may arise in manufacturing and/or during a scan of an image substrate. These issues affect the consistency and the clarity of test pattern images obtained by an optical sensor array.

Two types of test patterns are commonly used for obtaining data that may be used to adjust printing parameters for a printer. One type of test pattern, which is called a fiducial pattern, is printed with a predetermined pattern that facilitates detection and identification of the fiducial in the image developed from the electrical signals generated by the optical detectors in a sensor array. Once some or all of the fiducials are located in the image, this information may be used to determine a coordinate transformation between the internal representation of the image and the detected image. The coordinate transformation is used to translate between coordinates for ink drops on the image substrate and coordinates of the internal representation of the image. The other type of test pattern printed on an image substrate is a highly structured pattern that is used to measure one or more physical parameters of the ink drops, such as the presence, position, size, shape, and/or color of the ink drops. These measurement patterns are used to generate adjustment parameters that are used during printer operation to adjust digital images to be printed, to modify firing signals, and/or to modify the timing of firing signals to provide high quality images. In short, the fiducial patterns enable the image processor to identify a coordinate transformation between the external environment as it is captured by the image sensor array and the internal representation of the image that was rendered to produce the ink image. With that information, the image processor is then able to evaluate the more structured measurement patterns for adjustment parameter generation.

As noted above, measurements are affected by a variety of variations, including structure in an image substrate and/or image sensor system. Additionally, printers may include defective inkjets, some of which may have been fired unsuccessfully during generation of a fiducial pattern. Also, fiducial patterns and measurement patterns may be printed in close proximity to one another. Thus, measurement variations, the structure of the image substrate, the possibility of missing ink drops in a fiducial pattern, and the close proximity of fiducial and measurement patterns may make identification of the fiducial patterns by the image processor difficult. Moreover, the image processor needs to be able to locate correctly the fiducial patterns and to distinguish the fiducial patterns from the measurement patterns.

SUMMARY

In an effort to facilitate identification of fiducial patterns that are distinguishable from an imaging system and measurement patterns, a method has been developed to generate and evaluate fiducial patterns. The method includes generating a fiducial pattern for an image substrate, and measuring a difference between a structure of the fiducial pattern and at least one of a structure of a printing system and a structure of a measurement pattern to determine whether the structure of the fiducial pattern is distinguishable from at least one of the structure of the printing system and the structure of the measurement pattern.

The method may be implemented by a system that generates and evaluates fiducial pattern candidates. The printer includes a fiducial pattern generator configured to generate fiducial patterns, a fiducial pattern evaluator configured to measure a difference between a structure of the fiducial pattern and at least one of a structure of an image generating system and a structure of a measurement pattern to determine whether the structure of the fiducial pattern is distinguishable from at least one of the structure of the printing system and the structure of the measurement pattern.

BRIEF DESCRIPTION OF THE DRAWINGS

The foregoing aspects and other features of a printer that enable fiducial patterns to be generated that are more easily distinguished from imaging system structure and measurement patterns are explained in the following description, taken in connection with the accompanying drawings.

Figure 2A:
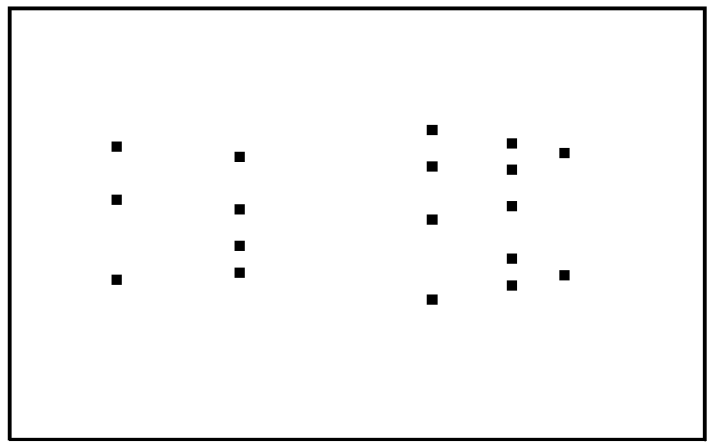
FIG. 2A is an example of a fiducial pattern with structure showing more self-similarity in the X direction and less in the Y direction.
Figure 2B:
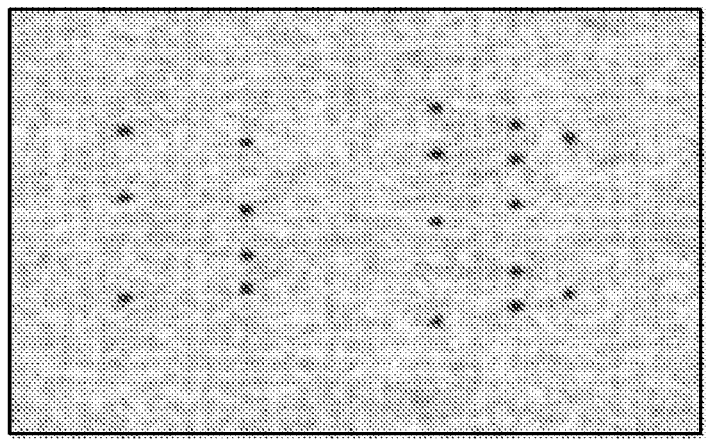
FIG. 2B is a portion of an image of an image substrate containing the fiducial pattern of FIG. 2A.
Figure 2C:
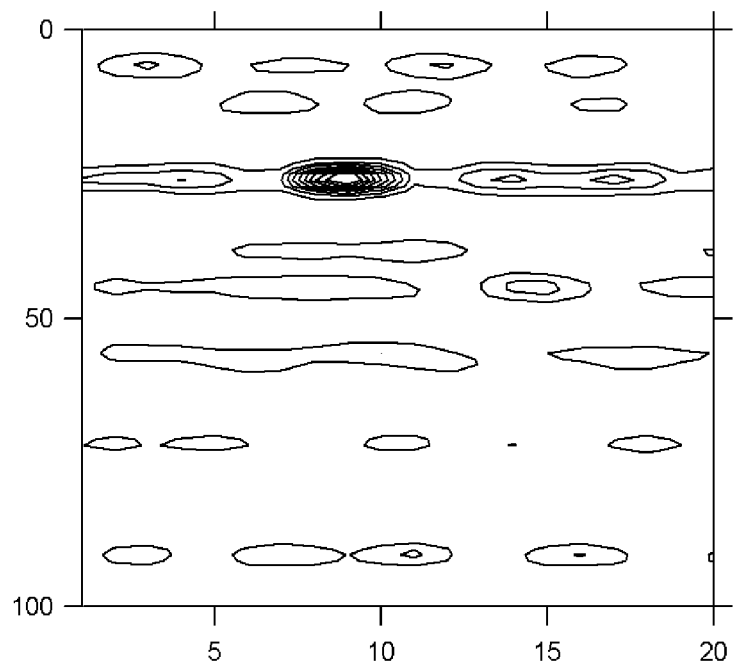
FIG. 2C is a pictorial representation of the correspondence scores that indicate the degree of alignment between a fiducial stencil pattern and a captured image over a region of interest.
Figure 2D:
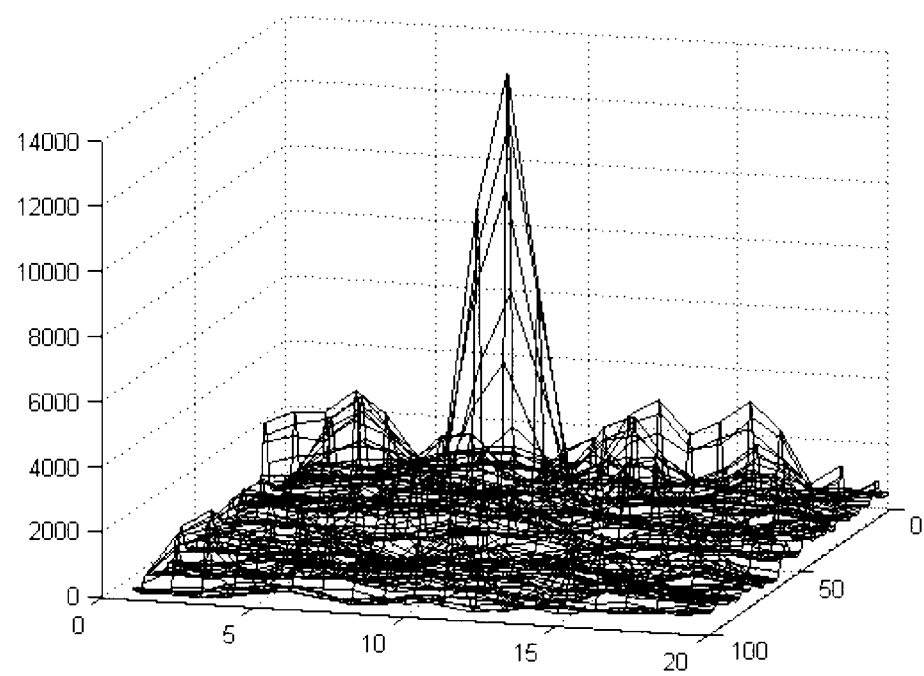

The correspondence scores for the pattern of FIG. 2A within the image of FIG. 2B over a two dimensional region of interest are shown as a surface plot in FIG. 2D.

Figure 3A:
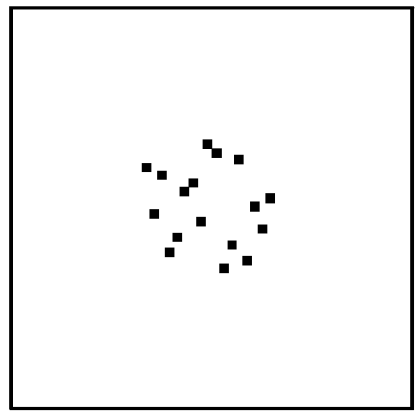

FIG. 3A is an example of a fiducial pattern structure with minimal self-similarity in both the X direction and the Y direction.

Figure 3B:
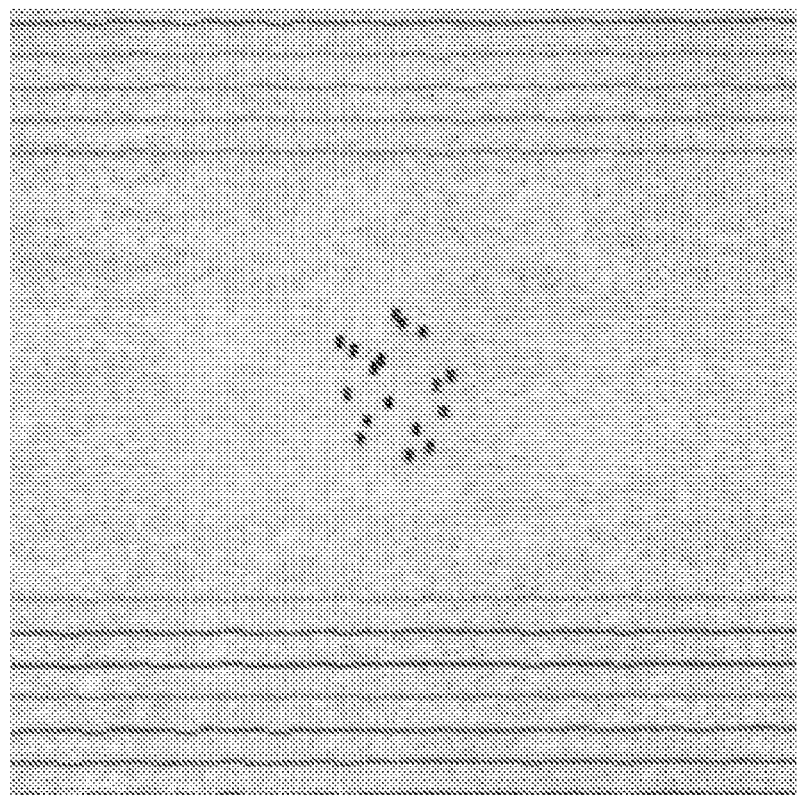

FIG. 3B is a portion of an image of an image substrate containing the fiducial pattern of FIG. 3A.

Figure 3C:
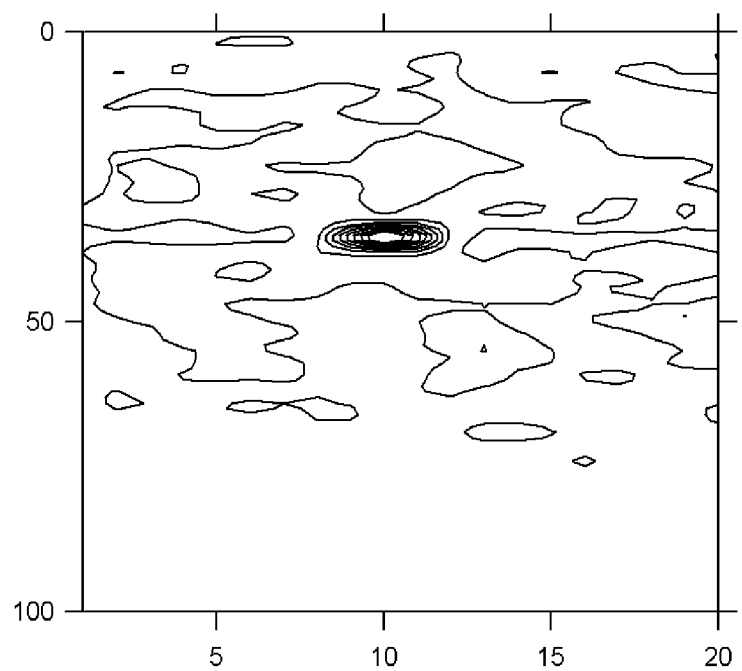

FIG. 3C is a pictorial representation of the correspondence scores that indicate the degree of alignment between a fiducial stencil pattern and a captured image over a region of interest.

Figure 3D:
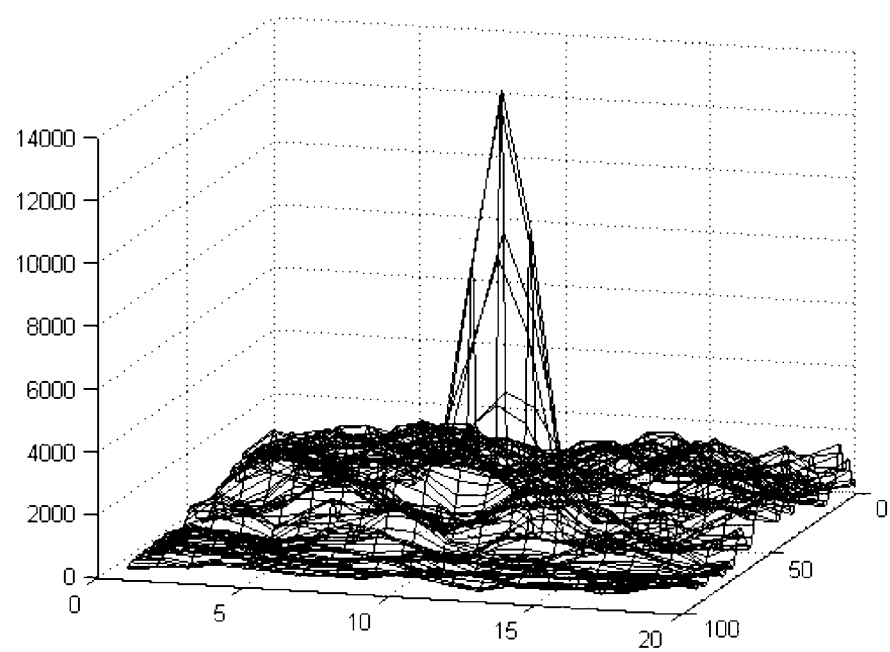

The correspondence scores for the pattern of FIG. 3A within the image of FIG. 3B over a two dimensional region of interest are shown as a surface plot in FIG. 3D.

Figure 1:
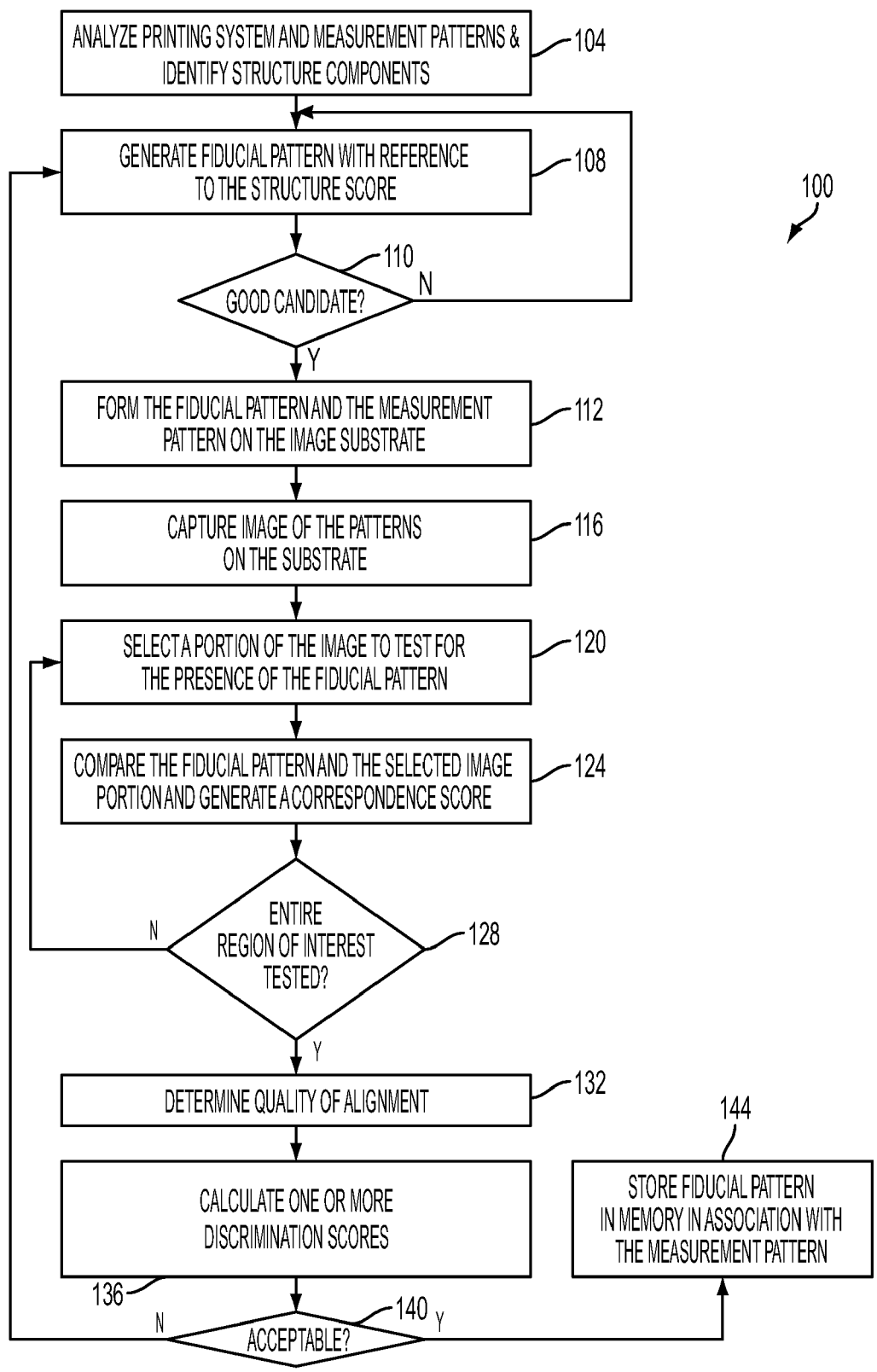
FIG. 1 is a flow diagram of a method for generating and evaluating fiducial pattern candidates.
Figure 4:
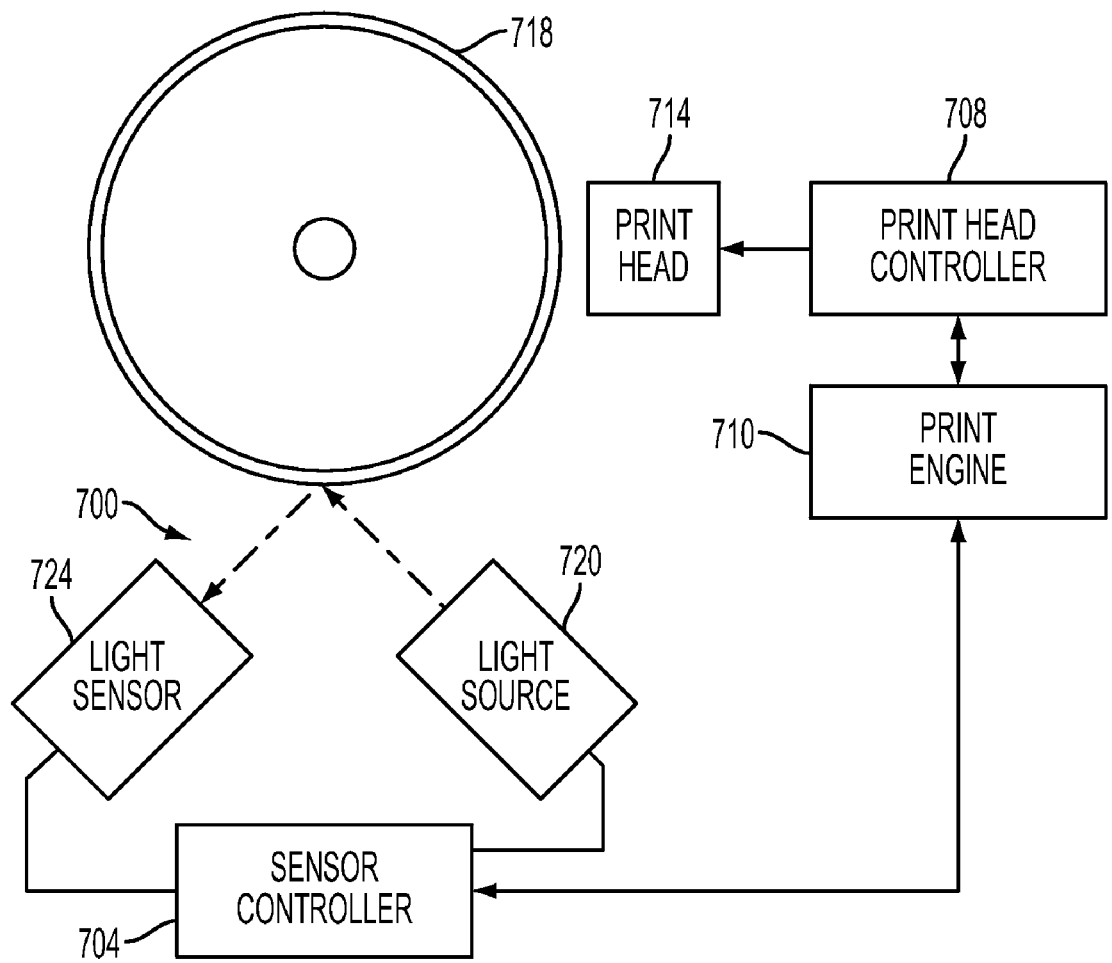

FIG. 4 is a block diagram of a system that may be used to implement the method of FIG. 1.

DETAILED DESCRIPTION

For a general understanding of the environment for the system and method disclosed herein as well as the details for the system and method, reference is made to the drawings. In the drawings, like reference numerals have been used throughout to designate like elements. As used herein, the word "printer" encompasses any apparatus that performs a print outputting function for any purpose, such as a digital copier, bookmaking machine, facsimile machine, a multi-function machine, etc.

FIG. 1 depicts a flow diagram of a method 100 for generating a fiducial pattern. Fiducial patterns are landmarks on an image substrate useful for locating other structure on the substrate. Measurement patterns are predetermined arrangements of pixels or other image forming elements. An imaging system captures an image of the measurement pattern after it has been generated on an image substrate and evaluates the captured pattern to adjust imaging parameters or detect anomalies in the imaging system. In order to evaluate images of measurement patterns properly, the image processor needs to be able to map the image coordinates to image substrate coordinates.

A fiducial pattern needs to be distinguishable from the intrinsic structure of the printing system, including that of the image substrate, and from the structure of the measurement pattern. The structure of the printing system and the structure of the measurement pattern may be analyzed to identify one or more spatial frequency or wavelet components. If a fiducial pattern also contains one or more of the same spatial frequency or wavelet components, then an image processor may be unable to distinguish between the fiducial pattern from the structure of the printing system and the measurement pattern. To avoid this potential issue, the method and the system described below generate a fiducial pattern that has structure distinguishable from the structure of the printing system and the measurement pattern formed on the image substrate.

The fiducial pattern has to help distinguish between alignment and non-alignment of an internal representation of a substrate having fiducial patterns and measurement patterns and the captured image of the substrate printed with these patterns. Moreover, the fiducial pattern needs to be identifiable even when partially obscured or partially missing in the captured image. The structure of a fiducial pattern is analyzed for self-similarity or for the tendency where subsets of the pattern appear similar. When similar subsets of the pattern exist, alignments of the internal representation and the captured image that swap similar subsets score well. This characteristic indicates that the potential for mistakes is greater. When a captured image is partially obscured or partially missing, minimizing self-similarity maximizes the likelihood that the partial fiducial pattern is unique and can be correctly located.

A method 100 that evaluates fiducial pattern candidates against these criteria is shown in FIG. 1. The structure of the printing system, including the image substrate is analyzed to identify one or more spatial frequency or wavelet components and the measurement patterns to be used are likewise analyzed to identify one or more spatial frequency or wavelet components (block 104). A fiducial pattern candidate is generated and evaluated with reference to the structural components of the analyzed printing system and measurement patterns (block 108). A random or pseudo-random sequence may be used to generate a fiducial pattern sequence. The fiducial pattern candidate is analyzed to identify the spatial or wavelet components in the fiducial pattern and the process determines whether the generated fiducial pattern has one or more of the same spatial frequency or wavelet components as the structure of the printing system, the structure of one of the measurement patterns, or whether the generated fiducial pattern shows a high degree of self-similarity (block 110). If any of these conditions exist, the fiducial pattern candidate is rejected and another fiducial pattern candidate is generated (block 108). In the example discussed above, a different seed or sequence process may be used to generate the next fiducial pattern candidate.

Sequence and array processes that may also be used to generate a fiducial pattern candidate include Golomb rulers and Costas arrays, which have minimal self-similarity and are robust to missing data. These processes may be used to generate some or all of the fiducial pattern for a candidate pattern. A fiducial pattern may be generated for an X by Y area. Each location within the area has an (x,y) coordinate pair that identifies the location. A Golomb ruler may be used to determine the positions of pixels in a line segment of the fiducial pattern. Alternatively, a Costas array may be used to locate the pixel positions in a subset area of the pattern. One or more Costas arrays may be used in a fiducial pattern. The patterns may be scaled so that a single pixel in a Golomb ruler or Costas array corresponds to k pixels or a k by k block of pixels in the fiducial pattern. One or more scalings may be used in the same fiducial pattern.

If the pattern candidate is a good candidate for further evaluation, the process of FIG. 1 continues by printing an image on the image substrate (block 112) and capturing an image of the substrate (block 116). The image printed on the image substrate corresponds to an internal representation and it includes the fiducial pattern and at least one measurement pattern. The fiducial pattern candidate is tested for discrimination between correspondence scores for good and poor alignments of the internal representation with the captured image of an image substrate. For this test, more than one image may be captured to realize an appropriate range of variation. Additionally, the printing system may be modified to simulate obscured, absent data, or otherwise distorted data. Correspondence scores are computed for at least one good alignment between the internal representation and a captured image and for at least one bad alignment, although more correspondence scores may be computed. The internal representation used to generate an image on an image substrate may be identical to the fiducial pattern or it may be modified to account for differences in printing and scanning pixel sizes, optical distortion, or other systemic behavior.

The alignment test may be implemented by selecting a portion of the generated image that corresponds to an area as large as the fiducial pattern (block 120, FIG. 1). The fiducial pattern is compared to the selected image portion to generate a correspondence score (block 124). The selection of an image portion (block 120) and the generation of a correspondence score (block 124) continues until a correspondence score is generated for each selected image portion within a region of interest in the image of the image substrate (block 128). The quality of alignment may be determined observationally or by comparing the measurement pattern in memory with selected image portions in the image of the image substrate to determine whether all or a portion of the fiducial pattern was mistakenly identified (block 132). The process continues by calculating one or more discrimination scores (block 136). A discrimination score indicates the ability of the fiducial pattern to discriminate between correspondence scores of well-aligned and poorly aligned captured images with the internal representation. Methods for determining discrimination scores include calculating signal to noise ratio (SNR) and the peak width near alignment. The process may continue iteratively until an acceptable fiducial pattern is identified (block 140). The generated fiducial pattern is stored in association with the measurement pattern in a memory (block 144). Thereafter, the fiducial pattern may be retrieved and used with the measurement pattern.

In many systems that use fiducial patterns to generate a coordinate transformation to translate between an internal representation of an image and positions within a captured image of that image printed on the substrate, multiple fiducial patterns are formed on the substrate. Multiple fiducial patterns, sometimes chosen for their proximity to a measurement pattern, may be used in concert for determining a coordinate transformation. Multiple measurement patterns can have independent or shared coordinate transformations.

As shown in FIG. 2A, the cross-process imaging direction corresponds to the horizontal dimension while the imaging direction corresponds to the vertical direction. If the X coordinate corresponds to the cross-process direction and the Y coordinate corresponds to the process direction, then the coordinate pair (x,y) defines any position in the fiducial pattern area shown in FIG. 2A. The black dot positions of the fiducial pattern of FIG. 2A show more self-similarity with translations in the x-direction than the y-direction. Consequently, correspondence scores for this pattern show more discrimination in the y-direction than in the x-direction. In the fiducial pattern of FIG. 3A, however, variation in the placement of pixels occurs in both the X and the Y directions. The fiducial pattern in FIG. 3A is based on a Costas array, which has the general property that all of the pairs of points have distinct displacement vectors. This property minimizes self-similarity in all directions and enhances the discrimination score. The fiducial pattern is also scaled with a 3×3 pixel block in the fiducial pattern replacing each 1×1 pixel in the Costas array to reduce the effect of absent ink.

FIG. 2B shows an image of the fiducial pattern of FIG. 2A formed with ink ejected from a printhead onto a print drum. Once the image is captured and stored within the printer, an internal representation or stencil corresponding to the fiducial pattern of FIG. 2A is applied to the image. The fiducial pattern of FIG. 2A is not as large as the image shown in FIG. 2B. The initial position selected may be, for example, the upper left pixel in the image. The upper left pixel of the fiducial pattern is superimposed in that position so the fiducial pattern covers the upper left portion of the image. A correspondence score is then calculated for this stencil. The fiducial pattern is then moved to another portion of the image, for example, the portion corresponding with the pixel that is one position to the right of the initial pixel being the upper leftmost pixel. Another correspondence score is computed. The movement of a single pixel to the right continues until the right edge of the fiducial pattern overlies the right edge of the image. After the correspondence score for that portion of the image is computed, the fiducial pattern may be dropped one position in the Y direction. The movement of the fiducial stencil pattern continues until the entire image has been covered by the fiducial stencil pattern and a correspondence score computed for each position of the stencil in the region of interest of the captured image. While one method of fiducial pattern movement has been described, other methods may be used.

A correspondence score may be computed in a number of ways. In one embodiment, the fiducial pattern, such as the ones shown in FIG. 2A and FIG. 3A, are represented with white pixels having a scalar value of zero and the black pixels having a scalar value of one. After the fiducial stencil pattern is placed within the image, the complementary grayscale values of the image pixels are multiplied by the scalar value in the corresponding fiducial pattern pixel to generate an array of products. Each of these products is then raised to a power p and these values are summed to produce the correspondence score. In another embodiment, the fiducial pattern is represented with white and black pixels having values scaled to the light and dark response of the optical sensors. The absolute value of the difference between the grayscale values of the image pixel and corresponding fiducial pixels are raised to the power p, summed, and then raised to the power 1/p to produce the correspondence score.

The correspondence scores for the pattern of FIG. 2A within the image of FIG. 2B over the two dimensional region of interest are shown as a contour plot in FIG. 2C and as a surface plot in FIG. 2D. Similarly, the correspondence scores for the pattern of FIG. 3A within the image of FIG. 3B over the two dimensional region of interest are shown as a contour plot in FIG. 3C and as a surface plot in FIG. 3D. The x value and the y value of the peak in the correspondence scores determines the coordinate position corresponding to the position of the fiducial stencil pattern in the captured image that best matches the fiducial pattern. The correspondence scores away from the peak represent the poorly aligned comparisons that must be discriminated from the peak. Note that the secondary peaks in FIG. 2C are absent in FIG. 3C, which indicates an advantage for the latter fiducial pattern. The position of the fiducial pattern within this region of interest may now be stored and later used along with the other fiducial positions to calculate transformations.

A system is depicted in FIG. 4 that may be used to perform the method shown in FIG. 1. The system 700 includes a sensor controller 704 and a printhead controller 708 that are coupled to a print engine 710. The print engine 710 receives document data that are processed to generate control signals for the operation of a printer. After processing document data with device dependent filters, such as tone reproduction curves (TRCs), for example, pixel data may be provided to the print head controller 704 for generation of print head driving signals that are coupled to a print head 714. Of course, the printer may include multiple print heads coupled to the print head controller 704 as is well known. The print head driving signals cause piezoelectric elements to eject ink selectively onto an image substrate, such as a rotating print drum 718, for example. To generate a coordinate transformation matrix, the print engine 710 generates pixel data for fiducial patterns and measurement patterns. These pixel data are provided to the print head controller 708 for generation of driving signals that cause the print head 714 to eject ink in the fiducial and measurement patterns onto the image substrate.

Mounted proximate to the image substrate 718 are a light source 720 and a light sensor 724. The light source may be a single light emitting diode (LED) that is coupled to a light pipe that conveys light generated by the LED to one or more openings in the light pipe that direct light towards the image substrate. In another embodiment, the light source 720 is a plurality of LEDs arranged in an array. The LEDs in this embodiment direct light towards the image substrate. The LEDs of the light source are coupled to the sensor controller 708, which selectively activates the LEDs. The sensor controller 708 receives a signal from the print engine 710 that indicates the light source is to be activated and the reflected light captured.

The reflected light is measured by the light sensor 724. The light sensor 724, in one embodiment, is an array of photosensitive devices, such as charge coupled devices (CCDs). The photosensitive devices generate an electrical signal corresponding to the intensity or amount of light received by the photosensitive devices. These electrical signals may be converted to grayscale values and stored as an image in the device. The stored image may then be processed as described above to locate the fiducial pattern in the image. After each fiducial pattern in the image substrate image has been located, a coordinate transformation may then be generated and used to translate coordinates between internal representations and a captured image of the image substrate. The sensor controller, print head controller, and print engine described herein and the functions that they perform may be implemented with general or specialized programmable processors that execute programmed instructions. The instructions and data required to perform the programmed functions may be stored in memory associated with the processors or controllers. The processors, their memories, and interface circuitry configure the controllers and/or print engine to perform the functions, such as the difference minimization function, described above. These components may be provided on a printed circuit card or provided as a circuit in an application specific integrated circuit (ASIC). Each of the circuits may be implemented with a separate processor or multiple circuits may be implemented on the same processor. Alternatively, the circuits may be implemented with discrete components or circuits provided in VLSI circuits. Also, the circuits described herein may be implemented with a combination of processors, ASICs, discrete components, or VLSI circuits.

In the description of the system above, the various components may be integrated in a single system or provided separately. For example, an internal representation of a fiducial pattern may be generated by a printer or similar device and, if it passes the self-similarity and related criteria, printed onto an image substrate, such as a media sheet. The media sheet may be removed from the device and imaged by an imaging system to generate a captured image of the substrate. The captured image may be transmitted to another system for the correspondence score and discrimination score analysis. If the system determines the correspondence and discrimination scores indicate the fiducial pattern candidate meets the criteria for being distinguishable from the imaging system and measurement patterns, a signal confirming acceptance of the fiducial pattern may be transmitted to the printing device or the signal may be generated for an operator who can actuate a menu selection for acceptance of the fiducial pattern on the printing device.

While the system and method described above have been discussed with reference to an ink printing device, they may be used with other imaging devices to develop coordinate transformations. For example, fiducial patterns are used in printed circuit board manufacture for developing a coordinate transformation to enable a robotic system to populate a board with components. Generation of the fiducial patterns for such applications, as well as other imaging applications, such as textile imaging or medical imaging, may be performed using the methods described above.

It will be appreciated that various of the above-disclosed and other features, and functions, or alternatives thereof, may be desirably combined into many other different systems or applications. Various presently unforeseen or unanticipated alternatives, modifications, variations, or improvements therein may be subsequently made by those skilled in the art, which are also intended to be encompassed by the following claims.

What is claimed is:

1. A method for generating a fiducial pattern for a printer comprising:
   generating a fiducial pattern for an image substrate with one of a random sequence and a pseudo-random sequence; and
   measuring a difference between a structure of the fiducial pattern and at least one of a structure of a printing system and a structure of a measurement pattern to determine whether the structure of the fiducial pattern is distinguishable from at least one of the structure of the printing system and the structure of the measurement pattern.

2. The method of claim 1, the measurement of the difference further comprising:
   identifying at least one spatial frequency or wavelet component in the structure of the fiducial pattern; and
   detecting whether the at least one spatial frequency or wavelet component in the structure of the fiducial pattern is a spatial frequency or wavelet component of the structure of the printing system.

3. The method of claim 1, the measurement of the difference further comprising:
   identifying at least one spatial frequency or wavelet component in the structure of the fiducial pattern; and
   detecting whether the at least one spatial frequency or wavelet component in the structure of the fiducial pattern is a spatial frequency or wavelet component of the structure of the measurement pattern.

4. The method of claim 1 further comprising:
   generating correspondence scores between a fiducial stencil pattern and a plurality of portions in a region of interest in an image of the image substrate on which the fiducial pattern and a measurement pattern have been printed.

5. The method of claim 4 further comprising:
   detecting a peak correspondence score as indicative of good alignment between the fiducial stencil pattern and one of the portions of the region of interest in the image of the image substrate.

6. The method of claim 4 further comprising:
   forming the image on the image substrate with a modified fiducial pattern.

7. The method of claim 6 wherein the modified fiducial pattern simulates distortion of a portion of the fiducial pattern.

8. The method of claim 4 further comprising:
   computing discrimination scores for the correspondence scores.

9. A method for generating a fiducial pattern for a printer comprising:
   generating a fiducial pattern for an image substrate with one of a Golomb ruler and a Costas array; and
   measuring a difference between a structure of the fiducial pattern and at least one of a structure of a printing system and a structure of a measurement pattern to determine whether the structure of the fiducial pattern is distinguishable from at least one of the structure of the printing system and the structure of the measurement pattern.

10. The method of claim 9, the measurement of the difference further comprising:
    identifying at least one spatial frequency or wavelet component in the structure of the fiducial pattern; and
    detecting whether the at least one spatial frequency or wavelet component in the structure of the fiducial pattern is a spatial frequency or wavelet component of the structure of the printing system.

11. The method of claim 9, the measurement of the difference further comprising:
    identifying at least one spatial frequency or wavelet component in the structure of the fiducial pattern; and
    detecting whether the at least one spatial frequency or wavelet component in the structure of the fiducial pattern is a spatial frequency or wavelet component of the structure of the measurement pattern.

12. The method of claim 9 further comprising:
    generating correspondence scores between a fiducial stencil pattern and a plurality of portions in a region of interest in an image of the image substrate on which the fiducial pattern and a measurement pattern have been printed.

13. The method of claim 12 further comprising:
    detecting a peak correspondence score as indicative of good alignment between the fiducial stencil pattern and one of the portions of the region of interest in the image of the image substrate.

14. The method of claim 12 further comprising:
    forming the image on the image substrate with a modified fiducial pattern.

15. The method of claim 14 wherein the modified fiducial pattern simulates distortion of a portion of the fiducial pattern.

16. The method of claim 12 further comprising:
    computing discrimination scores for the correspondence scores.

17. A method for generating a fiducial pattern for a printer comprising:
    generating a fiducial pattern for an image substrate;
    measuring a difference between a structure of the fiducial pattern and at least one of a structure of a printing system and a structure of a measurement pattern to determine whether the structure of the fiducial pattern is distinguishable from at least one of the structure of the printing system and the structure of the measurement pattern; and
    measuring self-similarity of the fiducial pattern.

18. The method of claim 17, the measurement of the difference further comprising:
    identifying at least one spatial frequency or wavelet component in the structure of the fiducial pattern; and
    detecting whether the at least one spatial frequency or wavelet component in the structure of the fiducial pattern is a spatial frequency or wavelet component of the structure of the printing system.

19. The method of claim 17, the measurement of the difference further comprising:
    identifying at least one spatial frequency or wavelet component in the structure of the fiducial pattern; and
    detecting whether the at least one spatial frequency or wavelet component in the structure of the fiducial pattern is a spatial frequency or wavelet component of the structure of the measurement pattern.

20. The method of claim 17 further comprising:
    generating correspondence scores between a fiducial stencil pattern and a plurality of portions in a region of interest in an image of the image substrate on which the fiducial pattern and a measurement pattern have been printed.

21. The method of claim 20 further comprising:
    detecting a peak correspondence score as indicative of good alignment between the fiducial stencil pattern and one of the portions of the region of interest in the image of the image substrate.

22. The method of claim 20 further comprising:
forming the image on the image substrate with a modified fiducial pattern.

23. The method of claim 22 wherein the modified fiducial pattern simulates distortion of a portion of the fiducial pattern.

24. The method of claim 20 further comprising:
computing discrimination scores for the correspondence scores.

25. A printer comprising:
a print head configured to eject ink onto an image substrate;
a print head controller configured to send driving signals to the print head to eject ink onto the image substrate; and
a print engine operatively connected to the print head controller, the print engine being configured to control the print head controller to send driving signals to the print head to form at least one fiducial pattern and at least one measurement pattern on the image substrate, the print engine also being configured to generate correspondence scores between a fiducial stencil pattern and a plurality of portions in a region of interest in an image of the image substrate on which the fiducial pattern and the measurement pattern have been formed, and to detect a peak correspondence score in the generated correspondence scores, the peak correspondence score being indicative of alignment of the fiducial stencil pattern with one of the portions of the region of interest in the image of the image substrate.

26. The printer of claim 25 further comprising:
an optical sensor array coupled to the print engine and configured to generate the image of the image substrate.

27. The printer of claim 25, the print engine being further configured to generate discrimination scores for the generated correspondence scores.

28. The printer of claim 25, the print engine further comprising:
a fiducial pattern generator configured to generate at least one fiducial pattern; and
a fiducial pattern evaluator configured to generate the correspondence scores by measuring a difference between a structure of the fiducial pattern and at least one of a structure of a printing system and a structure of the at least one measurement pattern to determine whether the structure of the fiducial pattern is distinguishable from at least one of the structure of the printing system and the structure of the measurement pattern.

29. The printer of claim 28, the fiducial pattern evaluator being further configured to identify at least one spatial frequency or wavelet component in the structure of the fiducial pattern and to detect whether the at least one spatial frequency or wavelet component in the structure of the fiducial pattern is a spatial frequency or wavelet component of the structure of the image generating system.

30. The printer of claim 28, the fiducial pattern evaluator being further configured to identify at least one spatial frequency or wavelet component in the structure of the fiducial pattern and to detect whether the at least one spatial frequency or wavelet component in the structure of the fiducial pattern is a spatial frequency or wavelet component of the structure of the measurement pattern.

31. A printer comprising:
a print head configured to eject ink onto an image substrate;
a print head controller configured to send driving signals to the print head to eject ink onto the image substrate;
a print engine operatively connected to the print head controller, the print engine being configured to control the print head controller to send driving signals to the print head to form at least one fiducial pattern and at least one measurement pattern on the image substrate, the print engine also being configured to generate correspondence scores between a fiducial stencil pattern and a plurality of portions in a region of interest in an image of the image substrate on which the fiducial pattern and the measurement pattern have been formed, the print engine further comprising:
a fiducial pattern generator configured to generate at least one fiducial pattern; and
a fiducial pattern evaluator configured to generate the correspondence scores by measuring a difference between a structure of the fiducial pattern and at least one of a structure of a printing system and a structure of the at least one measurement pattern to determine whether the structure of the fiducial pattern is distinguishable from at least one of the structure of the printing system and the structure of the measurement pattern, the fiducial pattern generator being further configured to use one of a random sequence and a pseudo-random sequence to generate the at least one fiducial pattern.

32. The printer of claim 31, the fiducial pattern evaluator being further configured to identify at least one spatial frequency or wavelet component in the structure of the fiducial pattern and to detect whether the at least one spatial frequency or wavelet component in the structure of the fiducial pattern is a spatial frequency or wavelet component of the structure of the image generating system.

33. The printer of claim 31, the fiducial pattern evaluator being further configured to identify at least one spatial frequency or wavelet component in the structure of the fiducial pattern and to detect whether the at least one spatial frequency or wavelet component in the structure of the fiducial pattern is a spatial frequency or wavelet component of the structure of the measurement pattern.

34. A printer comprising:
a print head configured to eject ink onto an image substrate;
a print head controller configured to send driving signals to the print head to eject ink onto the image substrate;
a print engine operatively connected to the print head controller, the print engine being configured to control the print head controller to send driving signals to the print head to form at least one fiducial pattern and at least one measurement pattern on the image substrate, the print engine also being configured to generate correspondence scores between a fiducial stencil pattern and a plurality of portions in a region of interest in an image of the image substrate on which the fiducial pattern and the measurement pattern have been formed, the print engine further comprising:
a fiducial pattern generator configured to generate at least one fiducial pattern; and
a fiducial pattern evaluator configured to generate the correspondence scores by measuring a difference between a structure of the fiducial pattern and at least one of a structure of a printing system and a structure of the at least one measurement pattern to determine whether the structure of the fiducial pattern is distinguishable from at least one of the structure of the printing system and the structure of the measurement pattern, the fiducial pattern generator being further configured to use one of a Golomb ruler and a Costas array to generate the at least one fiducial pattern.

35. The printer of claim 34, the fiducial pattern evaluator being further configured to identify at least one spatial frequency or wavelet component in the structure of the fiducial pattern and to detect whether the at least one spatial frequency or wavelet component in the structure of the fiducial pattern is a spatial frequency or wavelet component of the structure of the image generating system.

36. The printer of claim 34, the fiducial pattern evaluator being further configured to identify at least one spatial frequency or wavelet component in the structure of the fiducial pattern and to detect whether the at least one spatial frequency or wavelet component in the structure of the fiducial pattern is a spatial frequency or wavelet component of the structure of the measurement pattern.

\* \* \* \* \*